(12) United States Patent
Wu et al.

(10) Patent No.: US 7,129,529 B2
(45) Date of Patent: Oct. 31, 2006

(54) LIGHT EMITTING MODULE

(75) Inventors: Ming-Che Wu, Chiayi (TW);
Wen-Hsiung Yu, Nantou (TW);
Mao-Jen Wu, Kaohsiung (TW)

(73) Assignee: Neostones MicroFabrication Corporation, Hsinshu (TW)

( * ) Notice: Subject to any disclaimer, the term of this patent is extended or adjusted under 35 U.S.C. 154(b) by 96 days.

(21) Appl. No.: 10/971,554

(22) Filed: Oct. 22, 2004

(65) Prior Publication Data

US 2006/0086944 A1    Apr. 27, 2006

(51) Int. Cl.
*H01L 29/22* (2006.01)

(52) U.S. Cl. ............ 257/99; 257/88; 257/676; 257/E25.032; 368/241

(58) Field of Classification Search ............ None
See application file for complete search history.

(56) References Cited

U.S. PATENT DOCUMENTS

| 5,955,748 A | * | 9/1999 | Nakamura et al. ............ 257/88 |
| 6,639,251 B1 | | 10/2003 | Hung et al. |

* cited by examiner

*Primary Examiner*—Nathan J. Flynn
*Assistant Examiner*—Scott R. Wilson (57) ABSTRACT

The light emitting module includes a substrate, a light emitting element and a driving circuit chip. The light emitting element is attached to the substrate and has a plurality of first contacts on a top surface thereof. The driving circuit chip is attached onto the substrate and has a plurality of second contacts in direct connection to the first contacts one on one when being placed above the light emitting element.

16 Claims, 7 Drawing Sheets

LIGHT EMITTING MODULE

FIELD OF THE INVENTION

The present invention relates to a light emitting module, and more particularly to a light emitting module of an optoelectronic device for use in an image processing apparatus.

BACKGROUND OF THE INVENTION

Light emitting modules, for example light emitting diode (LED) arrays, are widely used in optoelectronic devices of image processing apparatus such as printing machines, copying machines or scanning machines.

Figure 1:
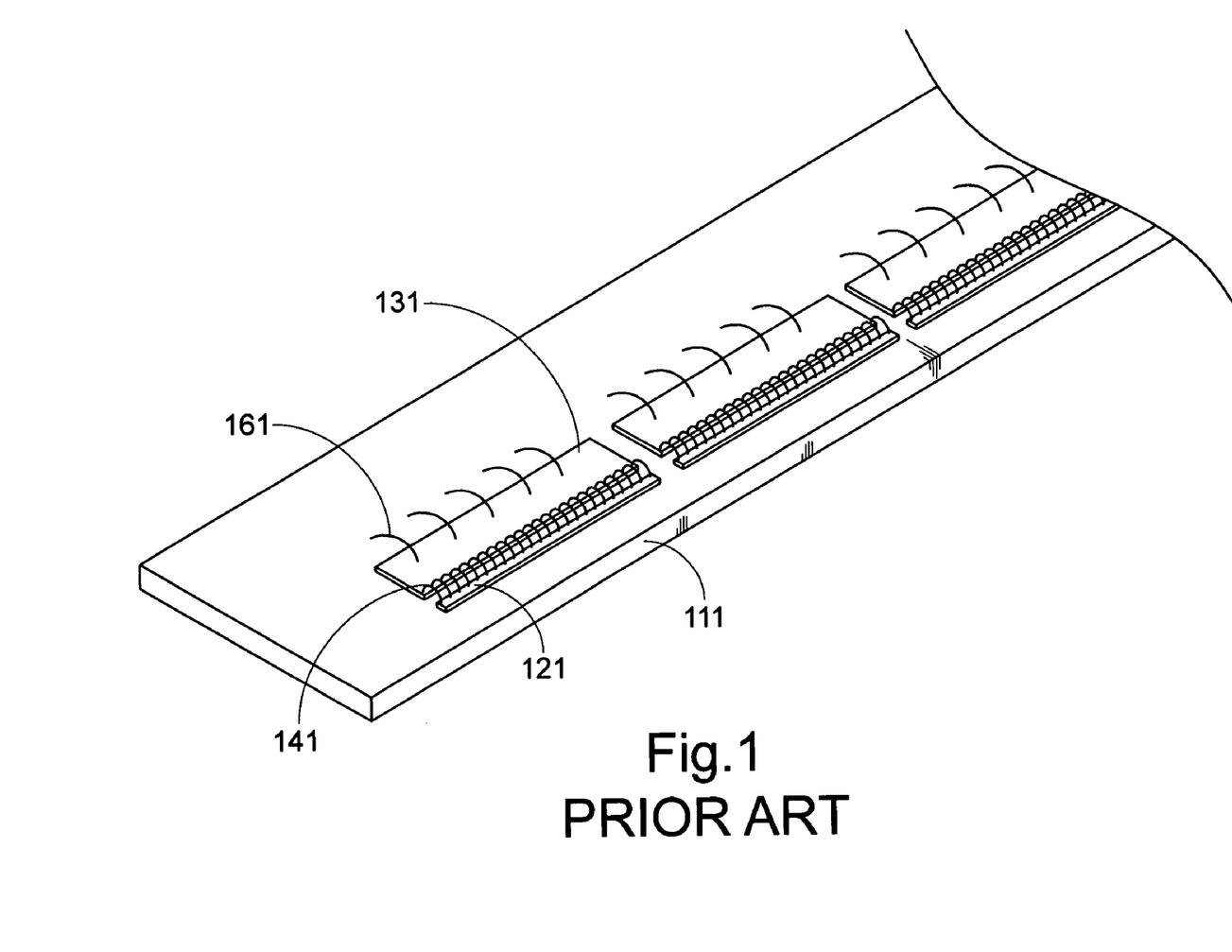
FIG. 1 is a schematic diagram partially showing a perspective view of a packaged structure of a conventional light emitting module.
Figure 2:
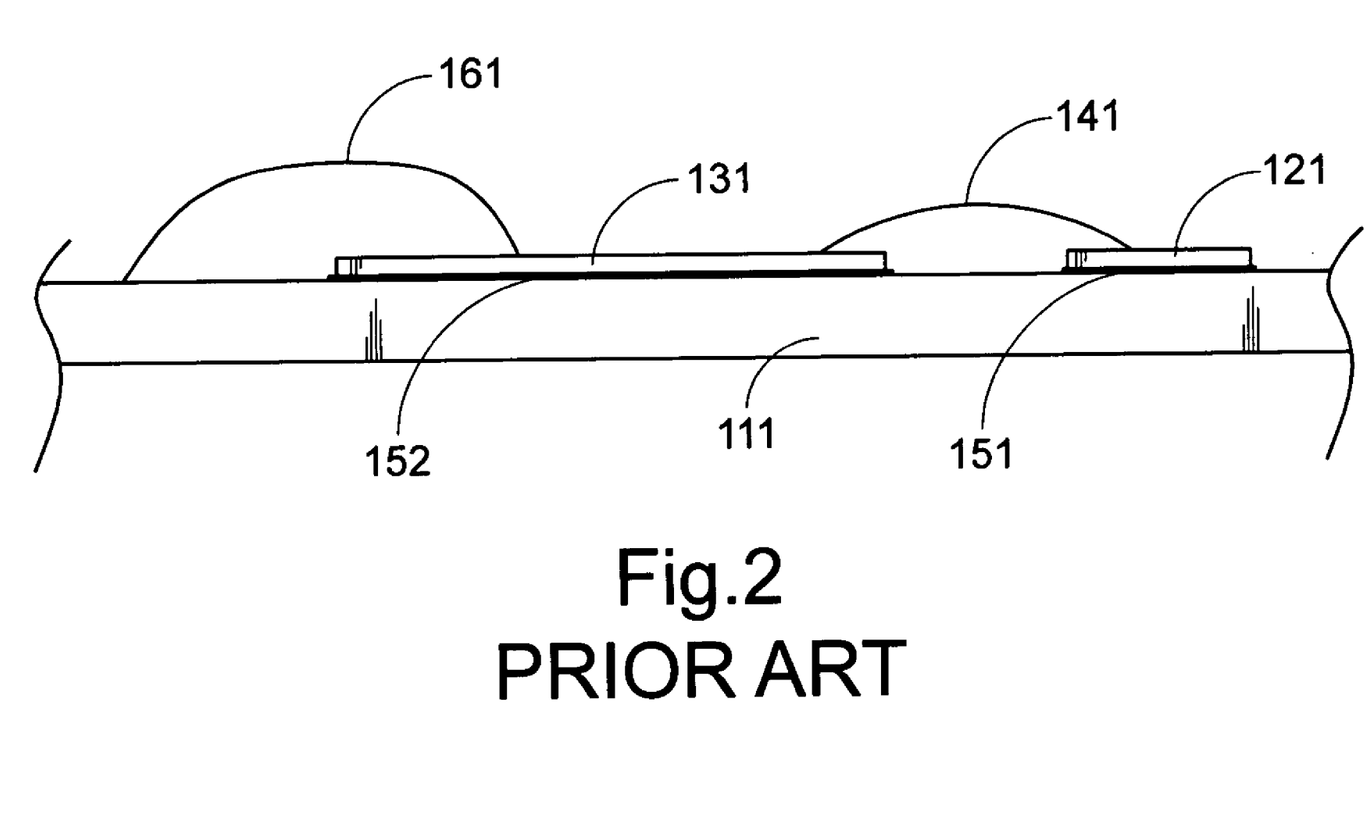
FIG. 2 is a schematic diagram showing a side view of the packaged structure of FIG. 1.

Referring to FIGS. 1 and 2, a packaged structure of a conventional LED module is partially shown. The LED module comprises a substrate 111, a plurality of light emitting elements 121 adhered to the substrate 111 with adhesive material 151 and separate from one another for independently emitting light, and a plurality of driving circuit chips 131 adhered to the substrate 111 with adhesive material 152 and separate from one another for independently driving said light emitting elements 121. The driving circuit chips 131 are electrically connected to the light emitting elements 121 via bonding wires 141, respectively. The driving circuit chips 131 are further electrically connected to other elements on the substrate 111 via bonding wires 161.

Since the light emitting elements 121 and the driving circuit chips 131 are bonded to each other one on one with individual gold wires, there would be numerous wire bonding operations required to be performed in the manufacturing process of a light emitting module. Take an A4 size LED printer head for example. In order to accomplish a resolution of 600 dpi, about 5,000 pairs of I/O sites of the light emitting elements 121 and the driving circuit chips 131 need be connected together. In other words, about 5,000 wire bonding operations need be performed in order to complete the connection of the light emitting elements 121 with the driving circuit chips 131. The large number of wire bonding operations complicates the manufacturing process of the light emitting diode and thus adverse to the yield and manufacturing cost. If higher resolution is required, the number of wire-bonding operations need be increased accordingly. Currently, the reliable bonding pitch in a pad is about 100 micrometers. If the wiring density is further increased, the pitch will become less and thus the manufacturing of the device would become more difficult and costly.

SUMMARY OF THE INVENTION

The present invention provides a light emitting module with a reduced but reliable bonding pitch.

In accordance with a first aspect of the present invention, there is provided a light emitting module. The light emitting module comprises a substrate, a light emitting element and a driving circuit chip. The light emitting element is attached to the substrate and has a plurality of first contacts on a top surface thereof. The driving circuit chip is attached onto the substrate and has a plurality of second contacts in direct connection to the first contacts one on one when being placed above the light emitting element.

In an embodiment, the substrate has a trench on a top surface thereof for accommodating the light emitting element.

In an embodiment, the light emitting element is mounted into the trench with adhesive material.

In an embodiment, the top surface of the light emitting element in the trench is substantially at the same level with the top surface of the substrate.

In an embodiment, the second contacts and a plurality of third contacts are arranged on a bottom surface of the driving circuit chip, and the third contacts are in direct connection to fourth contacts arranged on the top surface of the substrate when the driving circuit chip is placed above the light emitting element and the substrate.

In an embodiment, the second and third contacts are identical conductive bumps formed on both sides of the driving circuit chip, respectively.

According to the present invention, a pitch between two adjacent ones of the second contacts could be less than 50 micrometers.

Preferably, the substrate is an organic or non-organic printed circuit board.

Preferably, the light emitting element is a light emitting diode, a liquid crystal display element or a laser light source element.

Preferably, the light emitting module is used in a printing machine, a copying machine or a scanning machine.

In accordance with a second aspect of the present invention, there is provided a light emitting module. The light emitting module comprises a substrate, a light emitting element and a driving circuit chip. The substrate has a trench on a first surface thereof. The light emitting element is disposed in the trench and has a plurality of first contacts exposed from the trench. The driving circuit chip has a plurality of second contacts electrically connected to the first contacts one on one for driving the light emitting element.

In an embodiment, a plurality of third contacts are formed on a bottom surface of the driving circuit chip together with the second contacts and electrically connected to fourth contacts arranged on the first surface of the substrate.

In an embodiment, the second and third contacts are conductive bumps arranged on the bottom surface of the driving circuit chip.

In an embodiment, the first contacts of the light emitting element in the trench are substantially at the same level with the fourth contacts of the substrate, and the conductive bumps are in direct connection to the first and fourth contacts when the driving circuit chip is placed above the light emitting element and the substrate.

In accordance with a third aspect of the present invention, there is provided a light emitting module. The light emitting module comprises a substrate, a light emitting element and a driving circuit chip. The substrate has a trench on a top surface thereof, wherein a plurality of contacts are arranged on the top surface of the substrate beside the trench. The light emitting element has a bottom surface attached to the substrate in the trench and a top surface exposed from the trench. A plurality of contacts are arranged on the top surface of the light emitting element, which are substantially at the same level with the contacts of the substrate. The driving circuit chip has a plurality of first conductive bumps in direct connection to the contacts of the light emitting element and a plurality of second conductive bumps in direction connection to the contacts of the substrate when the driving circuit chip is placed above the light emitting element and the substrate.

The above contents of the present invention will become more readily apparent to those ordinarily skilled in the art after reviewing the following detailed description and accompanying drawings, in which:

DETAILED DESCRIPTION OF THE PREFERRED EMBODIMENT

Figure 3A:
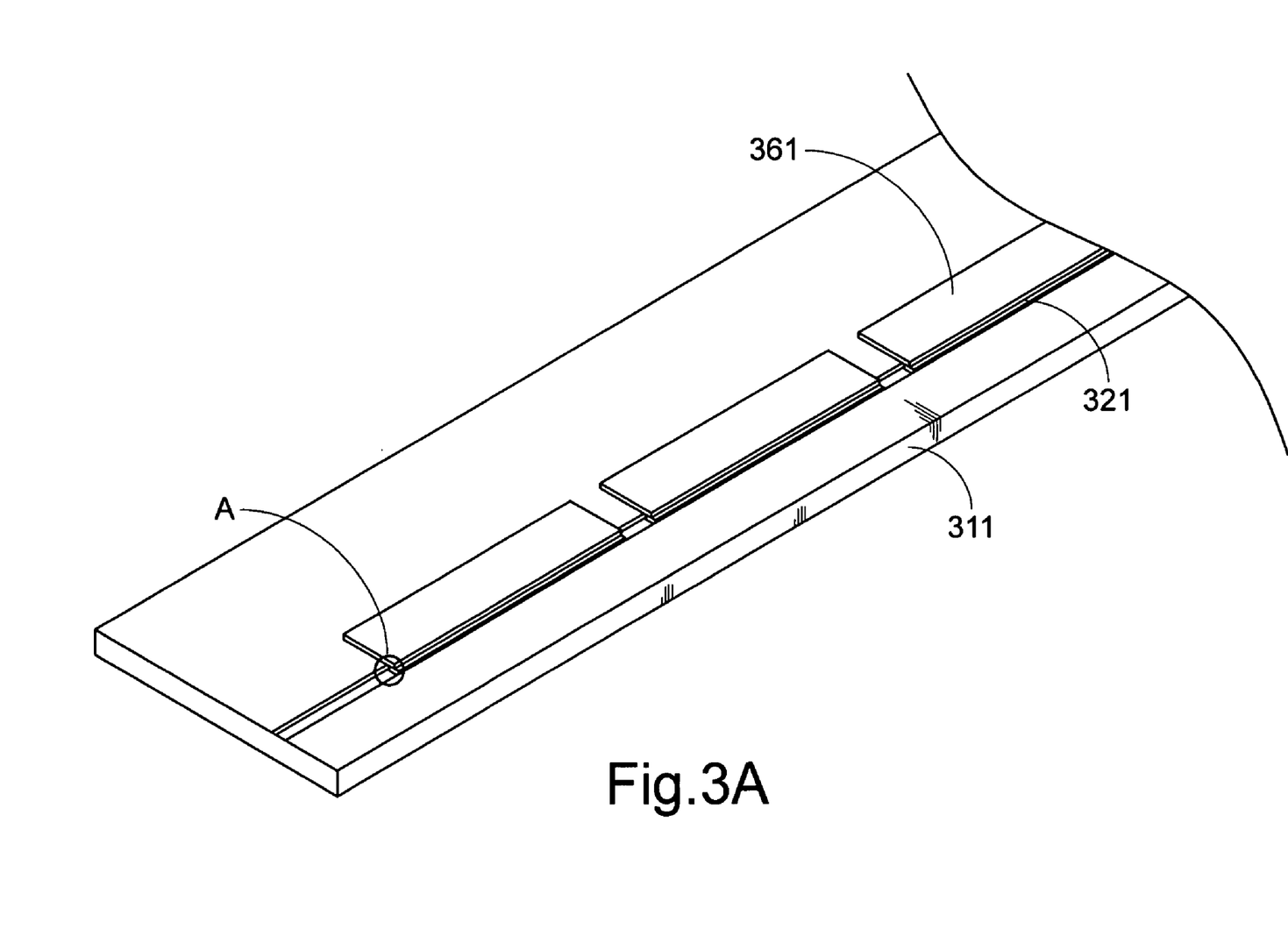
FIG. 3A is a schematic diagram partially showing a perspective view of a packaged structure of a light emitting module according to a preferred embodiment of the present invention.
Figure 3B:
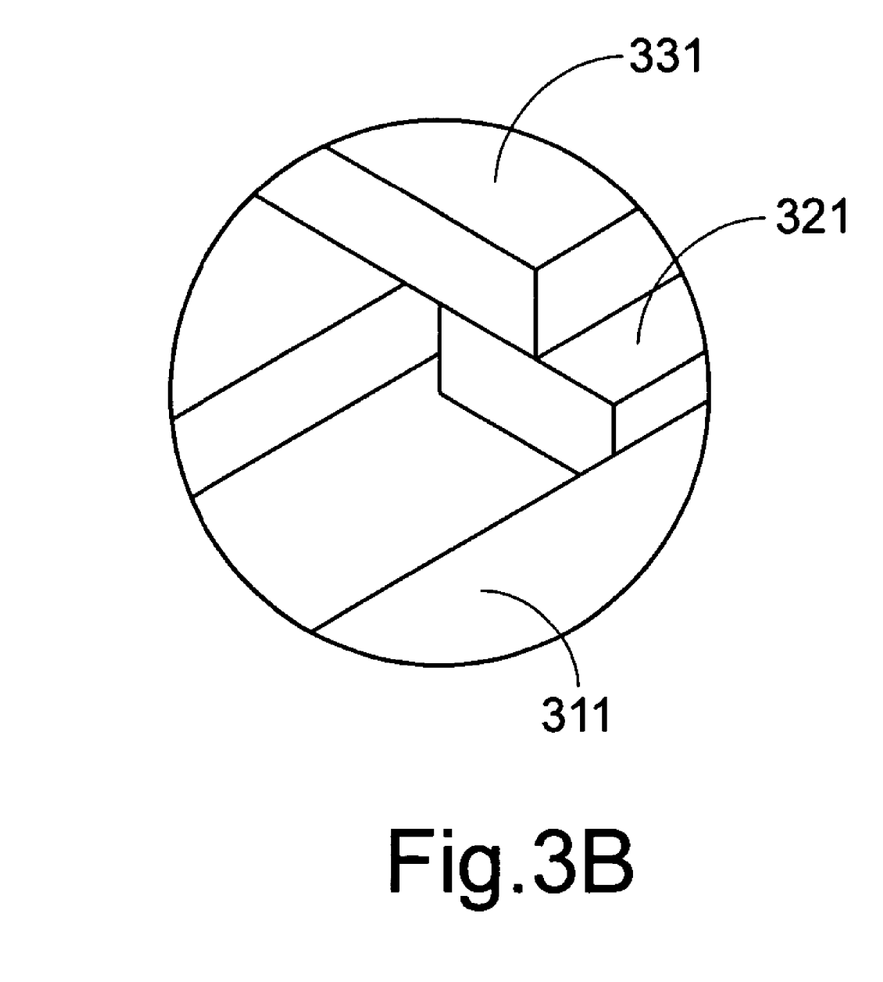
FIG. 3B is a partially enlarged view of the portion A in FIG. 3A.
Figure 4:
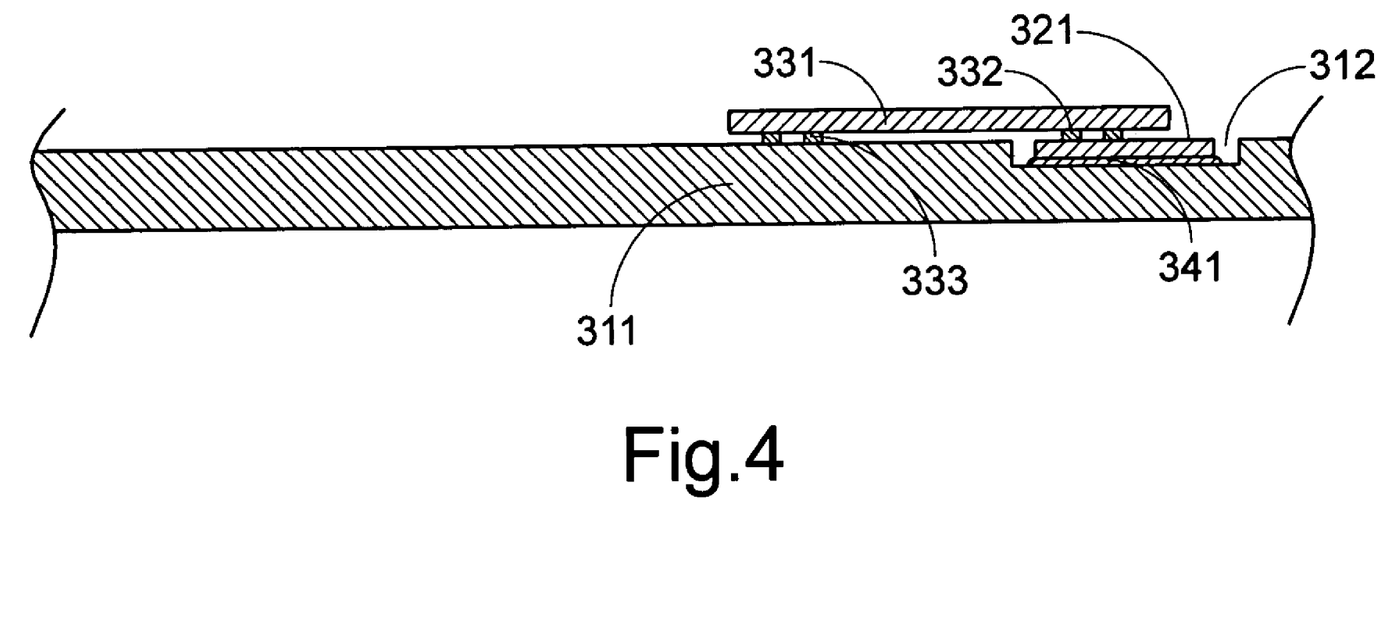
FIG. 4 is a schematic diagram showing a side view of the packaged structure of FIG. 3.

Referring to FIG. 3A, a packaged structure of an LED module according to a preferred embodiment is partially shown. The LED module comprises a substrate 311, a plurality of light emitting elements 321 and a plurality of driving circuit chips 331 for driving the light emitting elements 321. The substrate has a trench 312 on a top surface thereof for accommodating the light emitting element. These light emitting elements 321 are mounted into the trench 312 with adhesive material 341 and separate from one another for independently emitting light. The driving circuit chips 331 are then placed above the light emitting elements 321 and the substrate 311, as shown in FIG. 3B. On the bottom surfaces of the driving circuit chips 331, conductive bumps 332 and 333 are arranged for connecting to the light emitting elements 321 and the substrate 311, respectively, as shown in FIG. 4.

Figure 5:
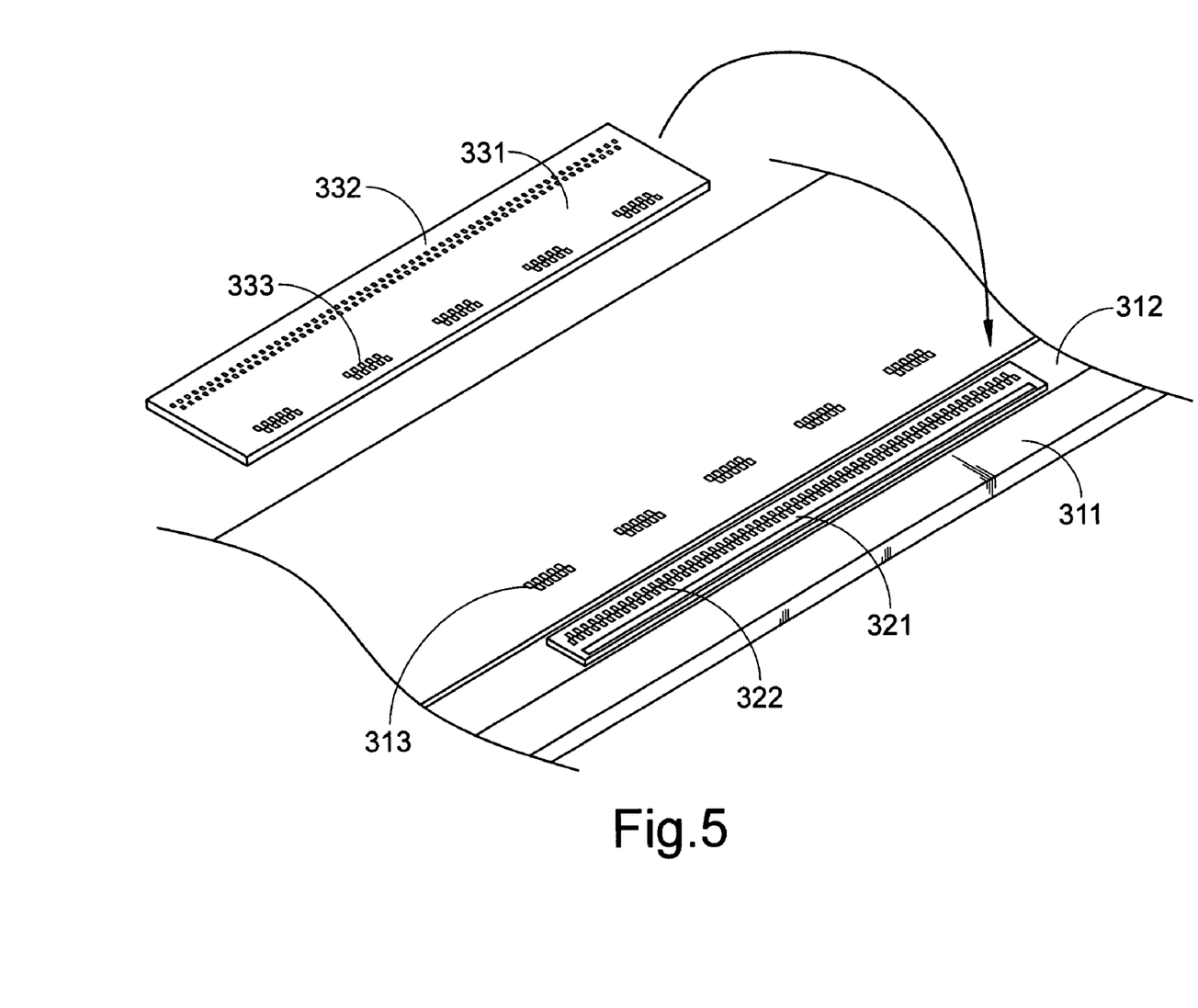
FIG. 5 is a resolving diagram schematically showing a top perspective view of an example of the light emitting module of FIG. 3.
Figure 6:
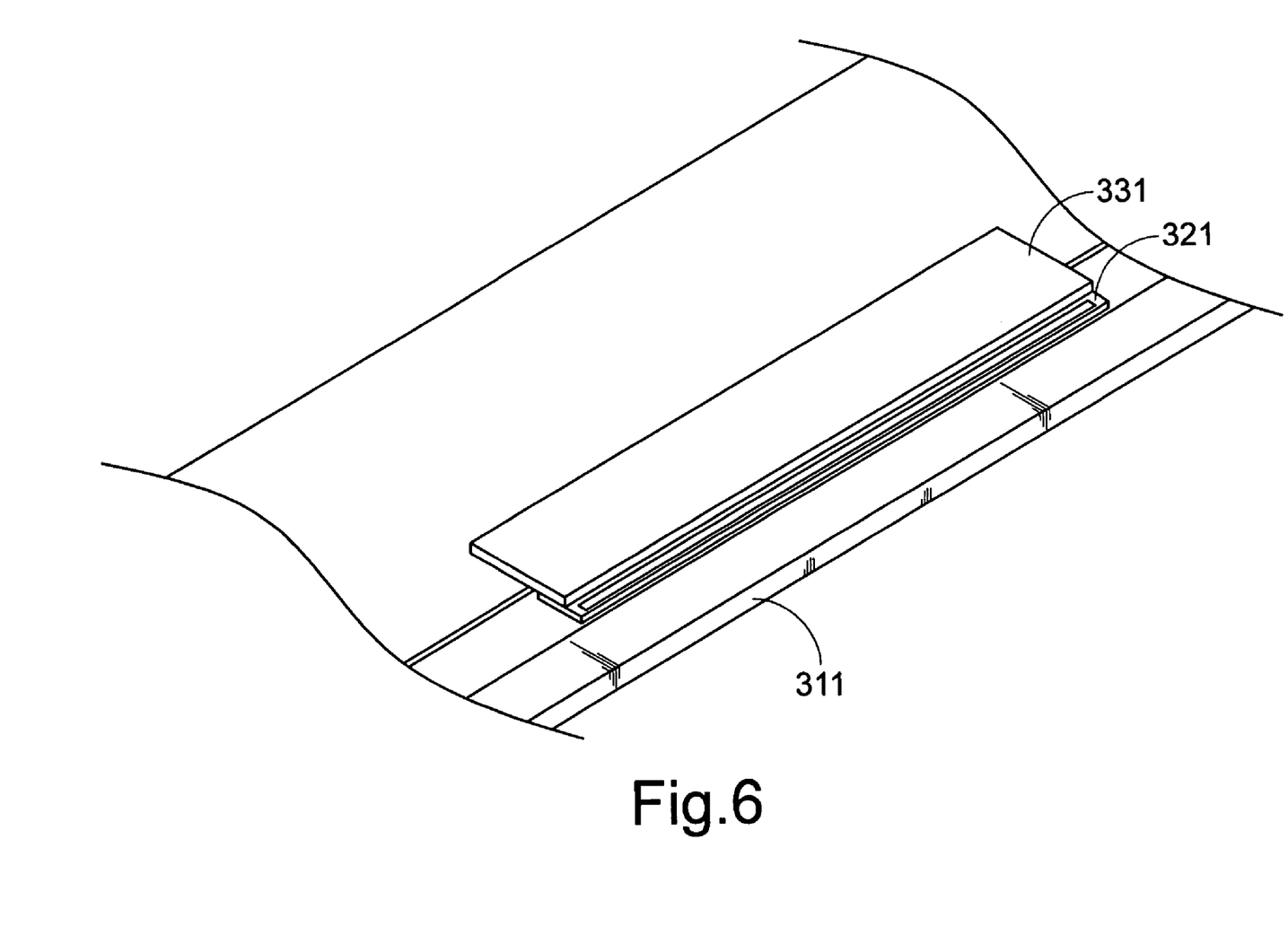
FIG. 6 is a schematic diagram showing a top perspective view of the assembled structure of FIG. 5.

FIG. 5 is a resolving diagram schematically showing the bottom surface of the driving circuit chip 331. The driving circuit chip 331 is of a flip chip type. The driving circuit chip 331 is firstly reversed and then put on the light emitting element 321 and substrate 311 in a manner that the conductive bumps 332 and 333 are precisely aligned with the contacts 322 and 313. Accordingly, the conductive bumps 332 on the bottom surface of the driving circuit chip 331 are in direct connection to the contacts 322 on the top surface of the light emitting element 321, and the conductive bumps 333 on the bottom surface of the driving circuit chip 331 are in direct connection to the contacts 313 on the top surface of the substrate 311. The assembled structure is shown in FIG. 6. For enhancing resolution of the LED module, the pitch between two adjacent conductive bumps 333 is reduced. By patterning the contacts 332 and 322 according to a microlithographic and etching process, the pitch can be lowered to less than 50 micrometers while maintaining reliable quality.

According to the present invention, the required elements for manufacturing an LED module can be reduced due to the omission of bonding wires. The simplified process of manufacturing the LED module is advantageous of increasing yield, reliability and resolution of the product and reducing the manufacturing cost. Further, taking an A4 size LED printer head for example, it takes about 15 minutes to perform the wire bonding operations 5,000 times according to prior art. In case of a resolution of 1,200 dpi, the number and time of the wire-bonding operations become double. On the contrary, there is no difference in the assembling time of the LED module of the present invention for different resolutions because the contacts can be integrally formed and no bonding operation is required.

For use in an image processing apparatus such as printing machines, copying machines or scanning machines, the substrate mentioned above can be a printed circuit board, and the light emitting element can be a light emitting diode, a liquid crystal display element or a laser light source element. The term "printed circuit board (PCB)" used herein widely indicates a variety of substrates mounted or formed thereon associated circuits. For example, the material of the PCB could be organic material currently used in the art or non-organic such as glass or ceramic.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A light emitting module, comprising:
   a substrate;
   a light emitting element attached to said substrate and having a plurality of first contacts on a top surface thereof; and
   a driving circuit chip attached onto said substrate and having a plurality of second contacts in direct connection to said first contacts one on one when being placed above said light emitting element, wherein a pitch between two adjacent ones of said second contacts is less than 50 micrometers.

2. The light emitting module according to claim 1 wherein said substrate has a trench on a top surface thereof for accommodating said light emitting element.

3. The light emitting module according to claim 2 wherein said light emitting element is mounted into said trench with adhesive material.

4. The light emitting module according to claim 2 wherein said top surface of said light emitting element in said trench is substantially at the same level with said top surface of said substrate.

5. The light emitting module according to claim 4 wherein said second contacts and a plurality of third contacts are arranged on a bottom surface of said driving circuit chip, and said third contacts are in direct connection to fourth contacts arranged on said top surface of said substrate when said driving circuit chip is placed above said light emitting element and said substrate.

6. The light emitting module according to claim 5 wherein said second and third contacts are identical conductive bumps formed on both sides of said driving circuit chip, respectively.

7. The light emitting module according to claim 1 wherein said second contacts and a plurality of third contacts are arranged on a bottom surface of said driving circuit chip, and said third contacts are in direct connection to fourth contacts arranged on said top surface of said substrate when said driving circuit chip is placed above said light emitting element and said substrate.

8. The light emitting module according to claim 7 wherein said second and third contacts are conductive bumps.

9. The light emitting module according to claim 1 wherein said substrate is a printed circuit board.

10. The light emitting module according to claim 1 wherein said light emitting element is a light emitting diode, a liquid crystal display element or a laser light source element.

11. A light emitting module, comprising:
a substrate having a trench on a first surface thereof;
a light emitting element disposed in said trench and having a plurality of first contacts exposed from said trench; and
a driving circuit chip having a plurality of second contacts electrically connected to said first contacts one on one for driving said light emitting element, wherein a pitch between two adjacent ones of said second contacts is less than 50 micrometers.

12. The light emitting module according to claim 11 wherein a plurality of third contacts are formed on a bottom surface of said driving circuit chip together with said second contacts and electrically connected to fourth contacts arranged on said first surface of said substrate.

13. The light emitting module according to claim 12 wherein said second and third contacts are conductive bumps arranged on said bottom surface of said driving circuit chip.

14. The light emitting module according to claim 13 wherein said first contacts of said light emitting element in said trench are substantially at the same level with said fourth contacts of said substrate, and said conductive bumps are in direct connection to said first and fourth contacts when said driving circuit chip is placed above said light emitting element and said substrate.

15. The light emitting module according to claim 11 wherein said substrate is a printed circuit board.

16. The light emitting module according to claim 11 wherein said light emitting element is a light emitting diode, a liquid crystal display element or a laser light source element.

* * * * *